US009923565B2

(12) United States Patent
Friend et al.

(10) Patent No.: US 9,923,565 B2
(45) Date of Patent: Mar. 20, 2018

(54) DIFFERENTIAL PHASE-FREQUENCY DETECTOR

(71) Applicant: International Business Machines Corporation, Armonk, NY (US)

(72) Inventors: David M. Friend, Rochester, MN (US); Grant P. Kesselring, Rochester, MN (US); James D. Strom, Rochester, MN (US); Alan P. Wagstaff, Rochester, MN (US)

(73) Assignee: International Business Machines Incorporated, Armonk, NY (US)

( * ) Notice: Subject to any disclaimer, the term of this patent is extended or adjusted under 35 U.S.C. 154(b) by 0 days.

(21) Appl. No.: 14/547,206

(22) Filed: Nov. 19, 2014

(65) Prior Publication Data

US 2016/0142062 A1    May 19, 2016

(51) Int. Cl.
*H03L 7/089*    (2006.01)
*H03L 7/085*    (2006.01)

(52) U.S. Cl.
CPC .............. *H03L 7/085* (2013.01); *H03L 7/089* (2013.01)

(58) Field of Classification Search
CPC .......... H03L 7/085; H03L 7/089; H03L 7/091
See application file for complete search history.

(56) References Cited

U.S. PATENT DOCUMENTS

| 5,422,603 | A | 6/1995 | Soyuer |
| 5,491,439 | A | 2/1996 | Kelkar et al. |
| 6,292,061 | B1 | 9/2001 | Qu |
| 6,721,380 | B2 | 4/2004 | Hairapetian et al. |
| 6,933,759 | B1 * | 8/2005 | Wu ...................... H03K 5/1565 327/100 |

(Continued)

FOREIGN PATENT DOCUMENTS

CN    101789785 A    7/2010

OTHER PUBLICATIONS

Anonymous, "Method for a balanced charge-pump for low-jitter performance," An IP.com Prior Art Database Technical Disclosure, Feb. 5, 2004, IP.com No. IPCOM000021756D.

(Continued)

*Primary Examiner* — Patrick O'Neill
(74) *Attorney, Agent, or Firm* — Wood, Herron & Evans, LLP; Robert R. Williams

(57) ABSTRACT

A phase-frequency detector (PFD) is electrically coupled to a charge pump of a phase-locked-loop (PLL). The PFD includes a first differential latch electrically coupled to the charge pump. The first differential latch drives a differential pair of increment signals to the charge pump in response to differential pairs of both reference clock signals and reset signals. The PFD also includes a second differential latch electrically coupled to the charge pump. The second differential latch drives a differential pair of decrement signals to the charge pump in response to differential pairs of both feedback clock signals and reset signals. The PFD also includes a differential AND gate electrically coupled to both the first differential latch and the second differential latch. The differential AND gate drives the differential pair of reset signals to both of the differential latches in response to the differential pairs of both increment signals and decrement signals.

20 Claims, 5 Drawing Sheets

(56) References Cited

U.S. PATENT DOCUMENTS

| | | | |
|---|---|---|---|
| 7,038,497 B2 * | 5/2006 | Meltzer | H03D 13/004 327/12 |
| 7,187,242 B2 | 3/2007 | Karlsson | |
| 7,496,136 B2 | 2/2009 | Lindner et al. | |
| 7,541,850 B1 | 6/2009 | Iravani | |
| 8,384,479 B2 | 2/2013 | Abbasi et al. | |
| 8,618,891 B2 | 12/2013 | Rehman | |
| 2002/0114416 A1 | 8/2002 | Enam et al. | |
| 2009/0039929 A1 | 2/2009 | Kossel | |

OTHER PUBLICATIONS

Zheng et al., "The Mixed-Signal Design of PLL with CMOS Technology," International Symposium on Signals, Systems, and Electronics, Jul. 30-Aug. 2, 2007, pp. 359-362, © 2007 IEEE DOI: 10.1109/ISSSE.2007.4294487.

* cited by examiner

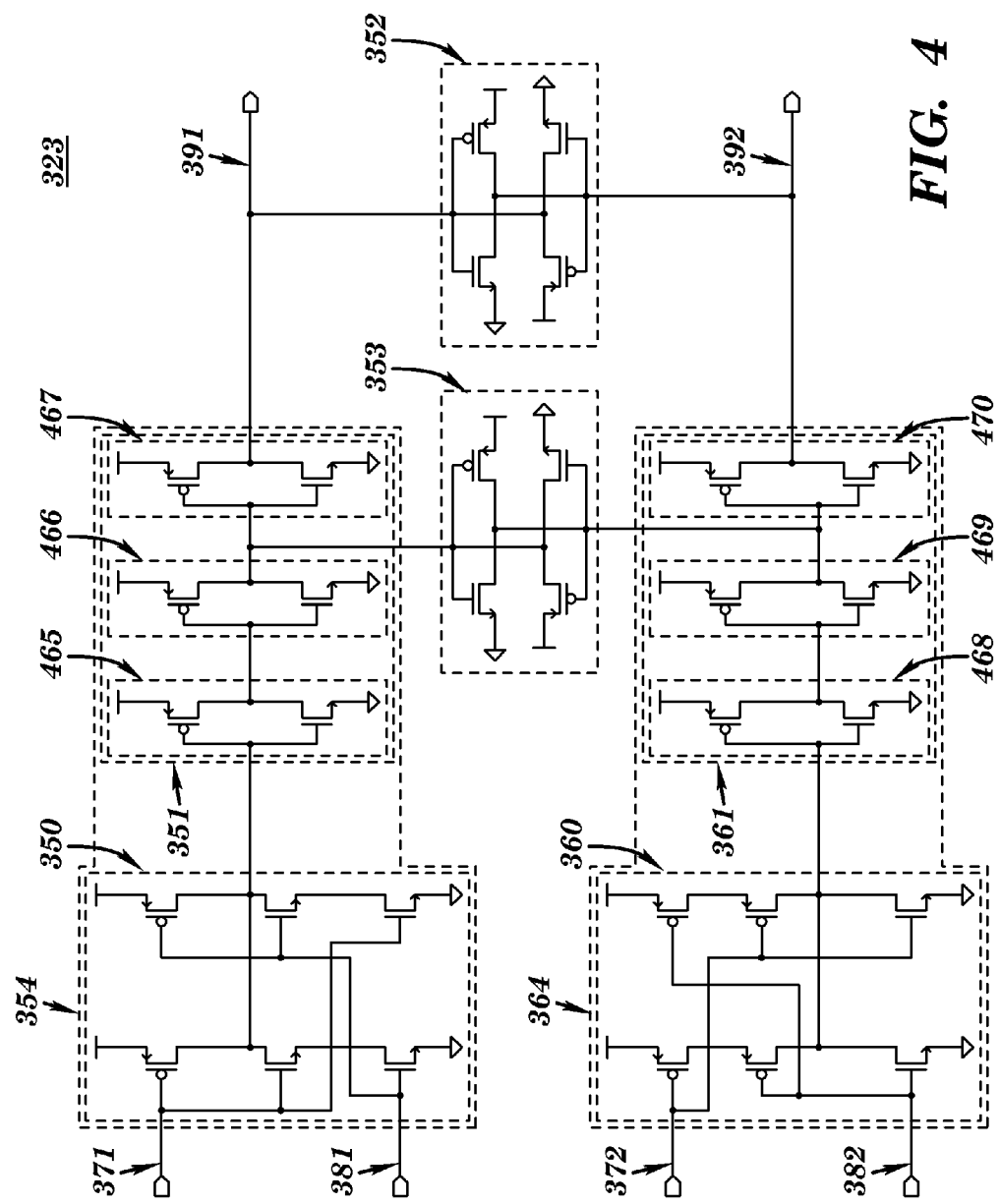

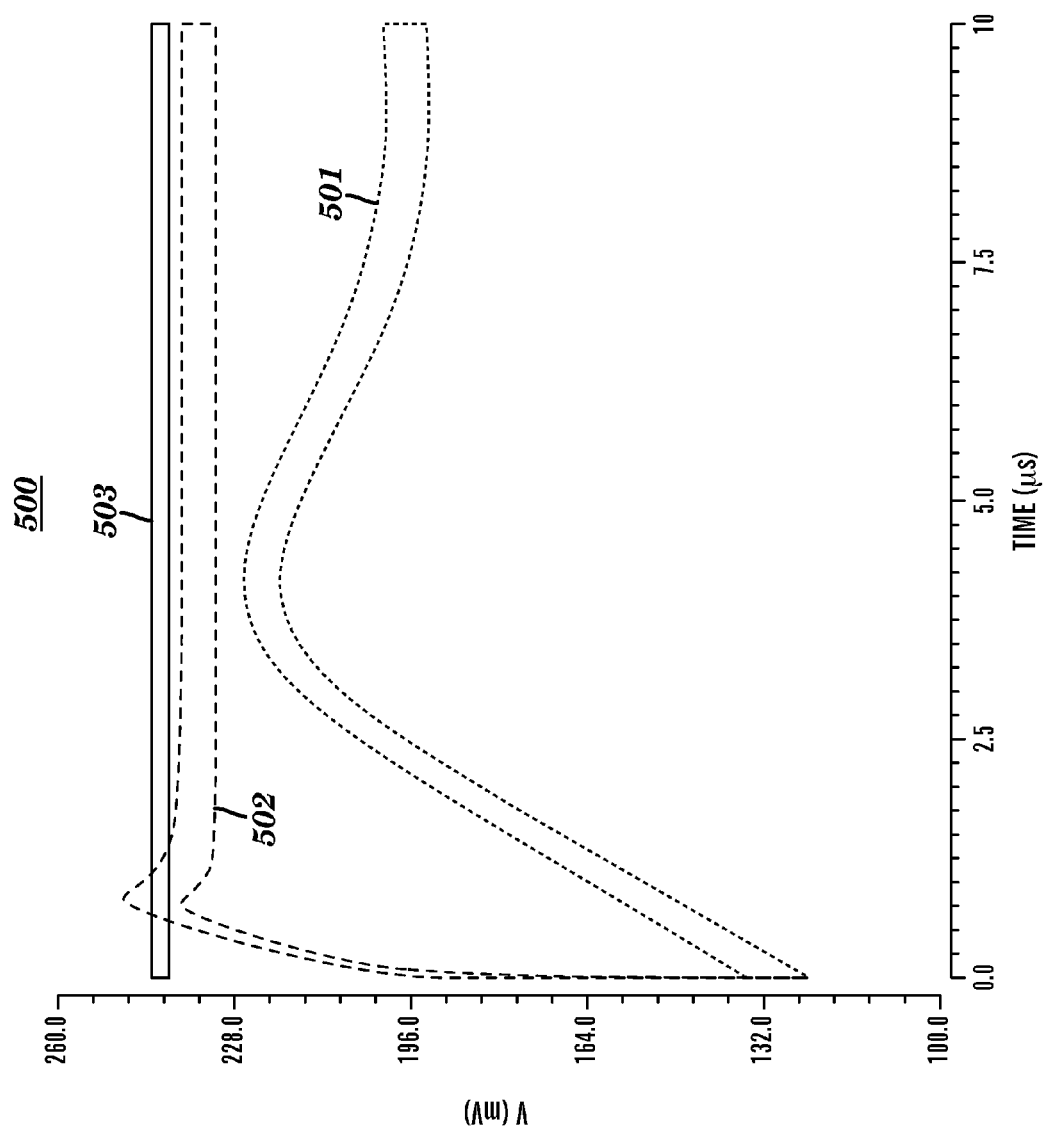

_US 9,923,565 B2_

DIFFERENTIAL PHASE-FREQUENCY DETECTOR

BACKGROUND

The present disclosure relates to a differential phase-frequency detector (PFD), and more specifically, to a differential PFD that is electrically coupled to a charge pump of a phase-locked-loop (PLL).

In a computer or other electronic system, clock signals may be used to control and sequence the flow of data between sequential storage elements, such as registers or latches on an integrated circuit. A clock circuit including a PLL may be useful to maintain precise phase relationships between a reference clock signal and a distributed clock signal that is used to sequence digital logic or other circuit elements. Precise clock phase relationships may be useful in achieving known and efficient timing relationships between sequential logic elements.

SUMMARY

According to embodiments of the present disclosure, aspects of the disclosure may include a phase-frequency detector (PFD) electrically coupled to a charge pump of a phase-locked-loop (PLL) and methods of operating such a PFD. The PFD includes a first differential latch electrically coupled to the charge pump. The first differential latch is configured to drive a differential pair of increment signals to the charge pump in response to receiving both a differential pair of reference clock signals and a differential pair of reset signals. The PFD also includes a second differential latch electrically coupled to the charge pump. The second differential latch is configured to drive a differential pair of decrement signals to the charge pump in response to receiving both a differential pair of feedback clock signals and the differential pair of reset signals. The PFD also includes a differential AND gate electrically coupled to both the first differential latch and the second differential latch. The differential AND gate is configured to drive the differential pair of reset signals to both the first differential latch and the second differential latch in response to receiving both the differential pair of increment signals from the first differential latch and the differential pair of decrement signals from the second differential latch.

Aspects of the disclosure may further include an apparatus for charging a capacitor. The apparatus includes a charge pump electrically coupled to the capacitor and a PFD electrically coupled to the charge pump.

The above summary is not intended to describe each illustrated embodiment or every implementation of the present disclosure.

BRIEF DESCRIPTION OF THE SEVERAL VIEWS OF THE DRAWINGS

The drawings included in the present application are incorporated into, and form part of, the specification. They illustrate embodiments of the present disclosure and, along with the description, serve to explain the principles of the disclosure. The drawings are only illustrative of some embodiments and do not limit the disclosure.

FIG. 4 illustrates a low level circuit diagram of the example differential AND gate depicted in FIG. 3, in accordance with embodiments of the present disclosure.

FIG. 5 illustrates a graph depicting the effect on the common mode feedback loop voltage of a PLL when a differential PFD is included in the PLL, in accordance with embodiments of the present disclosure.

Figure 1:
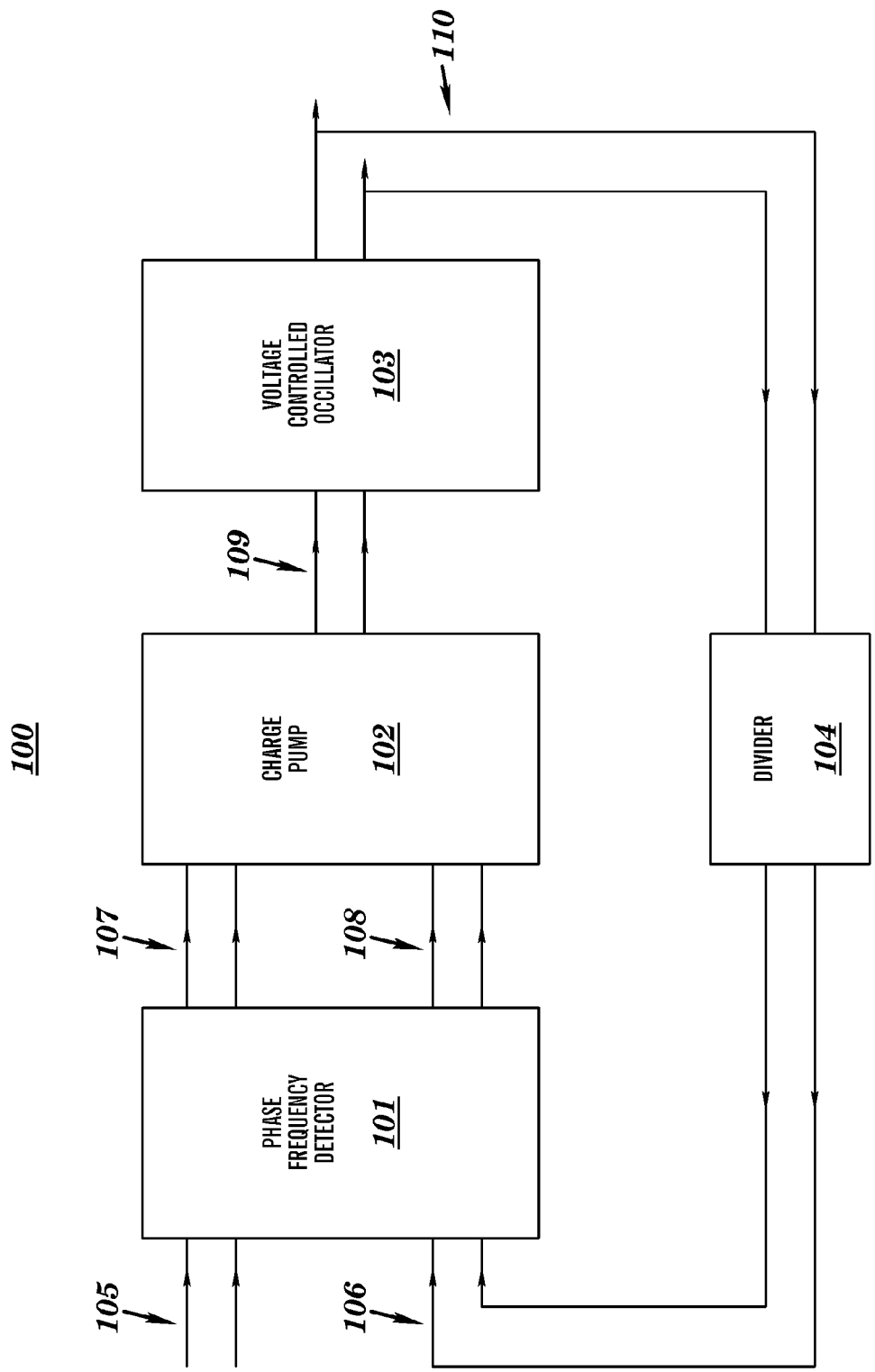
FIG. 1 illustrates a high level block diagram of an example phase-locked-loop (PLL), in accordance with embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to a differential phase-frequency detector (PFD), and more specifically, to a differential PFD that is electrically coupled to a charge pump of a phase-locked-loop (PLL). While the present disclosure is not necessarily limited to such applications, various aspects of the disclosure may be appreciated through a discussion of various examples using this context.

In some configurations of PLL topologies, a single-ended reference clock signal and a single-ended feedback clock signal may be compared by a PFD. Based on the comparison, a single-ended increment signal and single-ended decrement signal may go from the PFD to the charge pump of the PLL. Upon receiving the increment and decrement signals, the charge pump may pass current to a capacitor and store charge on the capacitor in the form of a voltage. In these configurations, the relative pulse widths of the increment and decrement signals may be proportional to the phase error between the reference clock signal and feedback clock signal.

At the end of each evaluation clock cycle, the PFD may reset. This reset may cause both the increment signal and decrement signal to go high for a brief period as the latches in the PFD are reset by a reset signal. When the PLL is locked, narrow reset signals may be issued from the PFD at the end of every reference clock cycle. The reset signals may be configured to allow the charge pump to maintain a proper common mode voltage within the PLL.

In some of these PLL configurations, charge pumps may require differential pairs of (e.g., true and complementary versions of) both increment signals and decrement signals. However, PFDs in these configurations may fail to generate true and complement signals without introducing skew. This skew between corresponding true and complement signals may introduce error in charge pumps, which may interfere with industry standards of usability and device compatibility. In particular, differential charge pumps (which offer certain advantages over their non-differential counterparts) may require both the true and complement increment and decrement signals. More specifically, the common mode control loop of such a differential charge pump may be sensitive to skew between these signals. This may be due at least in part because skew between true and complement signals may cause switches within the charge pump to transition at slightly different times, which may in turn create an offset in the common mode feedback bias voltage, and thereby compromise the ability of the common mode feedback loop to adjust the common mode. This in turn may cause additional charge pump current error.

In some configurations of PLL topologies, simple inverters or phase splitters may be used to generate true and complement signal pairs from each of the single-ended increment and decrement signals that are output from a PFD. It may be difficult, however, to eliminate skew between the signals of the pair when they are generated in such a manner. This may be especially true when conditions of voltage, temperature, or process are varied.

In some embodiments of the present invention, a differential PFD, rather than a conventional PFD, may be used to generate true and complementary signals. This may allow for a differential charge pump to receive these signal pairs from the PFD without the need to use one or more devices that may introduce skew (e.g., clock splitters) disposed between the PFD and the charge pump.

Furthermore, in some embodiments, a differential PFD may be made up of two differential latches, and a differential AND gate. The first differential latch may be clocked by true and complement reference clock signals (e.g., a differential pair of reference clock signals). The second differential latch may be clocked by true and complement feedback clock signals (e.g., a differential pair of feedback clock signals). Further, in some embodiments, on the rising edge of the true reference clock signal (and the falling edge of the complement reference clock signal), the first differential latch may be set so that at its output the true increment signal goes high (and the complement increment signal goes low). Similarly, on the rising edge of the true feedback clock signal (and the falling edge of the complement feedback clock signal) the second differential latch may be set so that at its output the true decrement signal goes high (and the complement decrement signal goes low). Further, when both differential latches are set, the differential AND gate may issue a differential pair of reset signals (including both a true reset signal and a complement reset signal) to both the first and second differential latches.

Turning now to FIG. 1, shown is a high level block diagram of an example PLL 100, in accordance with embodiments of the present disclosure. As shown, the PLL 100 includes a PFD 101, a charge pump 102, a voltage controlled oscillator 103, and a divider 104, all arranged in an electrically coupled circuit. During use of the PLL 100, the PFD 101 may receive a differential pair of reference clock signals 105 and a differential pair of feedback clock signals 106. Based on the input of these signals, the PFD 101 may output a differential pair of increment signals 107 and a differential pair of decrement signals 108 which are both received by the charge pump 102. The charge pump may then charge a capacitor and store charge on the capacitor in the form of a voltage. In some embodiments, pulse widths of the differential pair of increment signals 107 and the differential pair of decrement signals 108 may be proportional to the phase error between the differential pair of reference clock signals 105 and the differential pair of feedback clock signals 106.

Based on the input of the differential pair of increment signals 107 and the differential pair of decrement signals 108 into the charge pump 102, a differential pair of voltage signals 109 may be transmitted from the charge pump 102 to the VCO 103. Based on this differential voltage signal input 109, the VCO 103 may output a differential pair of main clock signals 110. This output from the VCO 103 may then be received by the divider 104 which may serve to divide the frequency of the differential pair of main clock signals 110 down to the appropriate frequency and then transmit the divided signals, as the differential pair of feedback clock signals 106, back to the PFD 101. This entire cycle through the PLL 100 may then be repeated.

Figure 2:
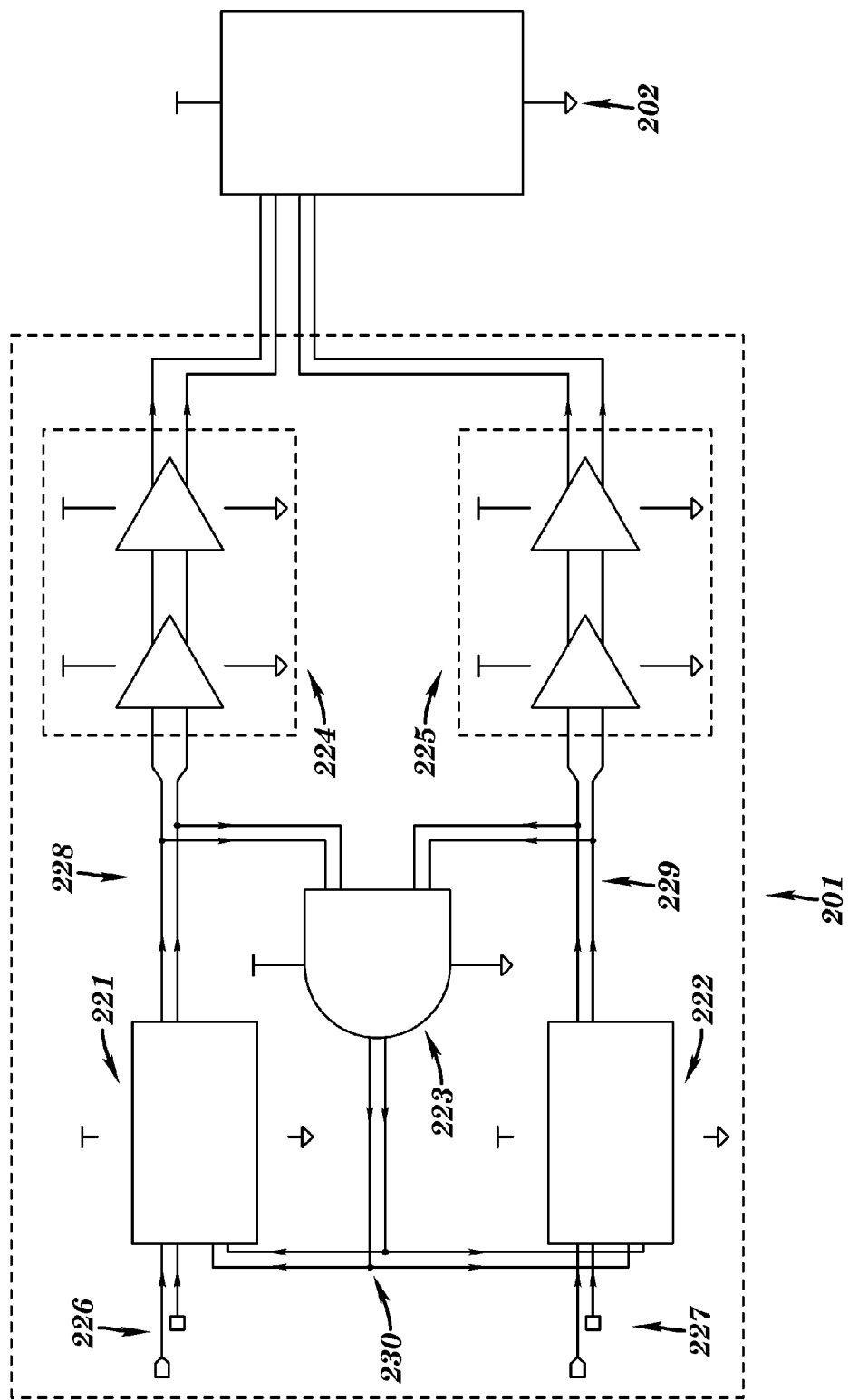
FIG. 2 illustrates a block diagram of an example phase-frequency detector (PFD) electrically coupled to an example charge pump, in accordance with embodiments of the present disclosure.

Turning now to FIG. 2, shown is a block diagram of an example PFD 201 electrically coupled to an example charge pump 202, in accordance with embodiments of the present disclosure. In some embodiments, PFD 201 and charge pump 202 may correspond to PFD 101 and charge pump 102, respectively, of FIG. 1. As depicted in FIG. 2, PFD 201 includes a first differential latch 221, a second differential latch 222, a differential AND gate 223, a first set of series-coupled buffers 224, and a second set of series-coupled buffers 225. In some embodiments, each of the devices (e.g., circuits) 221-225 may be complementary metal-oxide-semiconductor (CMOS) devices.

During use of the PFD 201, a differential pair of reference clock signals 226 may be received by the first differential latch 221. In response to this differential pair of reference clock signals 226, the first differential latch 221 may latch and drive a differential pair of increment signals 228. This differential pair of increment signals 228 may then pass through the first set of series-coupled buffers 224 and to an input of the charge pump 202. In some embodiments, the first set of series-coupled buffers 224 may include at least one buffer and may be configured to reduce any remaining skew in the differential pair of increment signals 228 as it passes through to the charge pump 202. In addition, upon being output from the first differential latch 221, the differential pair of increment signals 228 may also be driven to an input of the differential AND gate 223.

Also during use of the PFD 201, a differential pair of feedback clock signals 227 may be received by the second differential latch 222. In response to this differential pair of feedback clock signals 227, the second differential latch 222 may latch and drive a differential pair of decrement signals 229. This differential pair of decrement signals 229 may then pass through a second set of series-coupled buffers 225 and to an input of the charge pump 202. In some embodiments, the second set of series-coupled buffers 225 may include at least one buffer and may be configured to reduce any remaining skew in the differential pair of decrement signals 229 as it passes through to the charge pump 202. In addition, upon being output from the second differential latch 222, the differential pair of decrement signals 229 (like the differential pair of increment signals 228) may also be driven to an input of the differential AND gate 223.

Upon receiving the differential pair of increment signals 228 and the differential pair of decrement signals 229, the differential AND gate 223 may respond by driving a differential pair of reset signals 230 to inputs of both the first differential latch 221 and the second differential latch 222. In some embodiments, the transmission of the differential pair of reset signals 230 may cause the resetting of the current in the PFD 201 to the common mode.

Figure 3:
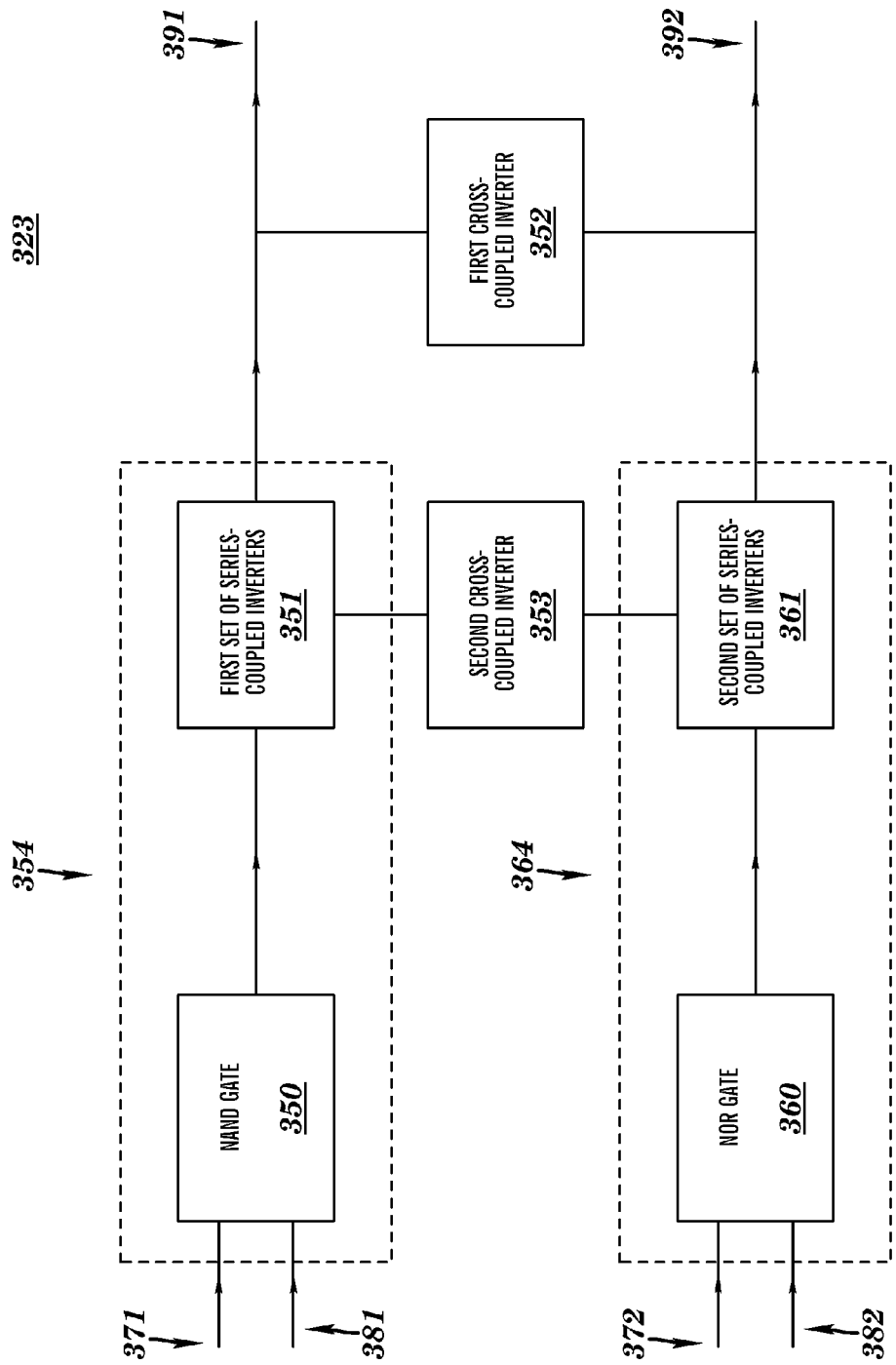
FIG. 3 illustrates a block diagram of an example differential AND gate with individual circuits therein depicted in block form, in accordance with embodiments of the present disclosure.

Turning now to FIG. 3, shown is a block diagram of an example differential AND gate 323 with individual circuits therein depicted in block form, in accordance with embodiments of the present disclosure. In some embodiments, differential AND gate 323 may correspond to differential AND gate 223 of FIG. 2. As depicted in FIG. 3, differential AND gate 323 includes a true reset circuit 354 (which itself includes a NAND gate 350 and a first set of series-coupled inverters 351) and a complement reset circuit 364 (which itself includes a NOR gate 360 and a second set of series-coupled inverters 361). In some embodiments, each set of series-coupled inverters 351 and 361 may include at least one inverter. Furthermore, in some embodiments, each set of series-coupled inverters 351 and 361 may include at least three inverters electrically-coupled together in series. Furthermore, in some embodiments, each set of series-coupled inverters 351 and 361 may each include any odd number of inverters electrically-coupled together in series. This may effectively allow each set of series-coupled inverters 351 and 361 to invert the output signals of the gates 350 and 360, respectively.

During use, the differential AND gate 323 may receive a differential pair of increment signals (which may correspond to the differential pair of increment signals 228 of FIG. 2), including a true increment signal 371 and a complement increment signal 372. The differential AND gate 323 may also receive a differential pair of decrement signals (which may correspond to the differential pair of decrement signals 229 of FIG. 2), including a true decrement signal 381 and a complement decrement signal 382. In particular, the differential AND gate 323 may receive both the true increment signal 371 and the true decrement signal 381 at inputs of the NAND gate 350 and may also receive both the complement increment signal 372 and the complement decrement signal 382 at inputs of the NOR gate 360.

During use of the true reset circuit 354, the NAND gate 350 may, in response to receiving the true increment signal 371 and the true decrement signal 381, drive an output signal to the first set of series-coupled inverters 351. The first set of series-coupled inverters 351 may then drive a true reset signal 391 out of the differential AND gate 323.

Similarly, during use of the complement reset circuit 364, the NOR gate 360 may, in response to receiving the complement increment signal 372 and the complement decrement signal 382, drive an output signal to the second set of series-coupled inverters 361. The second set of series-coupled inverters 361 may then drive a complement reset signal 392 out of the differential AND gate 323. Together the true reset signal 391 and the complement reset signal 392 may form a differential pair of reset signals, which may, in some embodiments, correspond to the differential pair of reset signals 230 of FIG. 2.

As shown, the differential AND gate 323 also includes a first cross-coupled inverter 352. In some embodiments, the first cross-coupled inverter 352 may be configured to reduce skew between the true reset signal 391 and the complement reset signal 392. This may occur because, in some situations, both the reset signal 391 and the complement reset signal 392 may need to be acting on the first cross-coupled inverter 352 at the same time in order for either signal to pass by it and out of the differential AND gate 323. Thus, if there is any skew between the reset signal 391 and the complement reset signal 392, the first cross-coupled inverter may force the signals back into realignment (or at least closer to realignment) before either signal passes out of the differential AND gate 323. As shown, a first terminal of the first cross-coupled inverter 352 is electrically coupled to an output of the true reset circuit 354 and a second terminal of the first cross-coupled inverter 352 is electrically coupled to an output of the complement reset circuit 364.

Likewise, the differential AND gate 323 may also include a second cross-coupled inverter 353, which may function in the same manner as the first cross-coupled inverter 352. As shown, the second cross-coupled inverter 353 is electrically coupled between the first set of series coupled inverters 351 and the second set of series-coupled inverters 361. While two cross-coupled inverters are depicted in FIG. 3, it is contemplated that in some embodiments any number of cross-coupled inverters may be used. Furthermore, some embodiments may not require any cross-coupled inverters.

Turning now to FIG. 4, shown is a low level circuit diagram of the example differential AND gate 323 depicted in FIG. 3, in accordance with embodiments of the present disclosure. In addition to the circuits described in reference to FIG. 3, also depicted are individual inverters 465, 466, and 467, which together form the first set of series-coupled inverters 351 and individual inverters 468, 469, and 470, which together form the second set of series-coupled inverters 361. In the depicted embodiment, a first terminal of the second cross-coupled inverter 353 is electrically coupled to the true reset circuit 354 between an output of the second individual inverter 466 of the first set of series coupled inverters 351 and an input of the third individual inverter 467 of the first set of series coupled inverters 351. Likewise, a second terminal of the second cross-coupled inverter 353 is electrically coupled to the complement reset circuit 364 between an output of the second individual inverter 469 of the second set of series-coupled inverters 361 and an input of the third individual inverter 470 of the second set of series-coupled inverters 361.

Turning now to FIG. 5, shown is a graph 500 depicting the effect on the common mode feedback loop voltage of a PLL when a differential PFD is included in the PLL, in accordance with embodiments of the present disclosure. As shown, the dotted line 501 represents the voltage level (in millivolts) over time (in microseconds) of the common mode feedback loop of a PLL including a conventional PFD (e.g., non-differential PFD). This can be compared with the dashed line 502, which represents the voltage level over time of the common mode feedback loop of a comparable PLL including a PFD designed according to embodiments of the disclosure (e.g., a differential PFD). More specifically, the dotted line 501 and dashed line 502 represent the voltages used to control the current sources (e.g., negative channel field effect transistor (NFET) current sources) in the charge pump of the PLL including the conventional PFD and in the charge pump of the PLL including the differential PFD, respectively, in order to regulate the common mode voltages of the respective PLL's. Also, shown in the solid line 503 is the ideal voltage in the common mode feedback loops of both PLL's.

As depicted, the skew generated in the PLL including the conventional PFD causes the common mode feedback loop voltage of that PLL (represented by dotted line 501) to vary significantly from the ideal voltage (represented by solid line 503). This sharply contrasts with the near-ideal common mode feedback loop voltage (represented by dashed line 502) of the PLL including the differential PFD designed according to embodiments of the disclosure.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A phase-frequency detector (PFD) electrically coupled to a charge pump of a phase-locked-loop (PLL), the PFD comprising:
a first differential latch electrically coupled to the charge pump, the first differential latch configured to, in response to receiving only a differential pair of reference clock signals and a differential pair of reset signals, drive a differential pair of increment signals to the charge pump;
a second differential latch electrically coupled to the charge pump, the second differential latch configured to, in response to receiving only a differential pair of feedback clock signals and the differential pair of reset signals, drive a differential pair of decrement signals to the charge pump; and
a differential AND gate electrically coupled to the first differential latch and further electrically coupled to the second differential latch, the differential AND gate having two inputs and an output, and producing a logic true output if and only if both inputs are logic true, the differential AND gate configured to, in response to receiving a true value from the differential pair of increment signals from the first differential latch and further in response to receiving a true value from the differential pair of decrement signals from the second differential latch, drive the differential pair of reset signals to the first differential latch and further drive the differential pair of reset signals to the second differential latch.

2. The PFD of claim 1, wherein the differential AND gate, the first differential latch, and the second differential latch are complementary metal-oxide-semiconductor (CMOS) devices.

3. The PFD of claim 2, wherein the differential pair of reference clock signals include a true reference clock signal and a complement reference clock signal, wherein the differential pair of feedback clock signals include a true feedback clock signal and a complement feedback clock signal, wherein the differential pair of increment signals include a true increment signal and a complement increment signal, wherein the differential pair of decrement signals include a true decrement signal and a complement decrement signal, and wherein the differential pair of reset signals include a true reset signal and a complement reset signal.

4. The PFD of claim 3, wherein the differential AND gate comprises:
a true reset circuit including a NAND gate and further including a first set of series-coupled inverters, an output of the NAND gate electrically coupled to an input of the first set of series-coupled inverters, the true reset circuit configured to, in response to receiving the true increment signal from the first differential latch and further in response to receiving the true decrement signal from the second differential latch, drive the true reset signal to the first differential latch and further drive the true reset signal to the second differential latch; and
a complement reset circuit including a NOR gate and further including a second set series-coupled inverters, an output of the NOR gate electrically coupled to an input of the second set of series-coupled inverters, the complement reset circuit configured to, in response to receiving the complement increment signal from the first differential latch and further in response to receiving the complement decrement signal from the second differential latch, drive the complement reset signal to the first differential latch and further drive the complement reset signal to the second differential latch.

5. The PFD of claim 4, wherein the differential AND gate further comprises:
a first cross-coupled inverter, a first terminal of the first cross-coupled inverter electrically coupled to an output of the true reset circuit, and a second terminal of the first cross-coupled inverter electrically coupled to an output of the complement reset circuit, the first cross-coupled inverter configured to reduce skew between the true reset signal and the complement reset signal.

6. The PFD of claim 5, wherein the first set of series-coupled inverters is a first set of at least three inverters, wherein the second set of series-coupled inverters is a second set of at least three inverters, and wherein the differential AND gate further comprises:
a second cross-coupled inverter, a first terminal of the second cross-coupled inverter electrically coupled to the true reset circuit between an output of a second inverter of the first set of at least three inverters and an input of a third inverter of the first set of at least three inverters, and a second terminal of the second cross-coupled inverter electrically coupled to the complement reset circuit between an output of a second inverter of the second set of at least three inverters and an input of a third inverter of the second set of at least three inverters, the second cross-coupled inverter configured to reduce skew between the true reset signal and the complement reset signal.

7. The PFD of claim 3, wherein a first at least one differential buffer is electrically coupled between an output of the first differential latch and the charge pump, the first at least one differential buffer configured to reduce skew between the true increment signal and the complement increment signal, and wherein a second at least one differential buffer is electrically coupled between an output of the second differential latch and the charge pump, the second at least one differential buffer configured to reduce skew between the true decrement signal and the complement decrement signal.

8. A method of operating a phase-frequency detector (PFD) electrically coupled to a charge pump of a phase-locked-loop (PLL), the method comprising:
driving, in response to receiving only a differential pair of reference clock signals at a first differential latch of the PFD and a differential pair of reset signals at the first differential latch, a differential pair of increment signals from the first differential latch to the charge pump and from the first differential latch to a differential AND gate of the PFD, the differential AND gate having two inputs and an output, and producing a logic high output if and only if both inputs are logic high;
driving, in response to receiving only a differential pair of feedback clock signals at a second differential latch of the PFD and the differential pair of reset signals at the second differential latch, a differential pair of decrement signals from the second differential latch to the charge pump and from the second differential latch to the differential AND gate; and
driving, in response to receiving a true value from the differential pair of increment signals from the first differential latch at the differential AND gate and further in response to receiving a true value from the differential pair of decrement signals from the second differential latch at the differential AND gate, the differential pair of reset signals from the differential AND gate to the first differential latch and from the differential AND gate to the second differential latch.

9. The method of claim 8, wherein the differential AND gate, the first differential latch, and the second differential latch are complementary metal-oxide-semiconductor (CMOS) devices.

10. The method of claim 9, wherein the differential pair of reference clock signals include a true reference clock signal and a complement reference clock signal, wherein the differential pair of feedback clock signals include a true feedback clock signal and a complement feedback clock signal, wherein the differential pair of increment signals include a true increment signal and a complement increment signal, wherein the differential pair of decrement signals include a true decrement signal and a complement decrement signal, and wherein the differential pair of reset signals include a true reset signal and a complement reset signal.

11. The method of claim 10, wherein the differential AND gate includes true a reset circuit, the true reset circuit including a NAND gate and further including a first set of series-coupled inverters having an input electrically coupled to an output of the NAND gate, and wherein the differential AND gate further includes a complement reset circuit, the complement reset circuit including a NOR gate and further including a second set of series-coupled inverters having an input electrically coupled to an output of the NOR gate, the method further comprising:
driving, in response to receiving the true increment signal from the first differential latch at the true reset circuit and further in response to receiving the true decrement signal from the second differential latch at the true reset circuit, the true reset signal from the true reset circuit to the first differential latch and further from the true reset circuit to the second differential latch; and
driving, in response to receiving the complement increment signal from the first differential latch at the complement reset circuit and further in response to receiving the complement decrement signal from the second differential latch at the complement reset circuit, the complement reset signal from the complement reset circuit to the first differential latch and further from the complement reset circuit to the second differential latch.

12. The method of claim 11, wherein the differential AND gate further includes a first cross-coupled inverter, the first cross-coupled inverter having a first terminal electrically coupled to an output of the true reset circuit and further having a second terminal electrically coupled to an output of the complement reset circuit, the method further comprising:
reducing skew between the true reset signal and the complement reset signal using the first cross-coupled inverter.

13. The method of claim 12, wherein the first set of series-coupled inverters is a first set of at least three inverters, wherein the second set of series-coupled inverters is a second set of at least three inverters, and wherein the differential AND gate further includes a second cross-coupled inverter, the second-cross couple inverter having a first terminal electrically coupled to the true reset circuit between an output of a second inverter of the first set of at least three inverters and an input of a third inverter of the first set of at least three inverters and further having a second terminal electrically coupled to the complement reset circuit between an output of a second inverter of the second set of at least three inverters and an input of a third inverter of the second set of at least three inverters, the method further comprising:

reducing skew between the true reset signal and the complement reset signal using the second cross-coupled inverter.

14. An apparatus for charging a capacitor, the apparatus comprising:
a charge pump electrically coupled to the capacitor;
a phase-frequency detector (PFD) electrically coupled to the charge pump, the PFD comprising:
a first differential latch electrically coupled to the charge pump, the first differential latch configured to, in response to receiving only a differential pair of reference clock signals and a differential pair of reset signals, drive a differential pair of increment signals to the charge pump;
a second differential latch electrically coupled to the charge pump, the second differential latch configured to, in response to receiving only a differential pair of feedback clock signals and the differential pair of reset signals, drive a differential pair of decrement signals to the charge pump; and
a differential AND gate electrically coupled to the first differential latch and further electrically coupled to the second differential latch, the differential AND gate having two inputs and an output, and producing a logic true output if and only if both inputs are logic true, the differential AND gate configured to, in response to receiving a true value from the differential pair of increment signals from the first differential latch and further in response to receiving a true value from the differential pair of decrement signals from the second differential latch, drive the differential pair of reset signals to the first differential latch and further drive the differential pair of reset signals to the second differential latch.

15. The apparatus of claim 14, wherein the differential AND gate, the first differential latch, and the second differential latch are complementary metal-oxide-semiconductor (CMOS) devices.

16. The apparatus of claim 15, wherein the differential pair of reference clock signals include a true reference clock signal and a complement reference clock signal, wherein the differential pair of feedback clock signals include a true feedback clock signal and a complement feedback clock signal, wherein the differential pair of increment signals include a true increment signal and a complement increment signal, wherein the differential pair of decrement signals include a true decrement signal and a complement decrement signal, and wherein the differential pair of reset signals include a true reset signal and a complement reset signal.

17. The apparatus of claim 16, wherein the differential AND gate comprises:
a true reset circuit including a NAND gate and further including a first set of series-coupled inverters, an output of the NAND gate electrically coupled to an input of the first set of series-coupled inverters, the true reset circuit configured to, in response to receiving the true increment signal from the first differential latch and further in response to receiving the true decrement signal from the second differential latch, drive the true reset signal to the first differential latch and further drive the true reset signal to the second differential latch; and
a complement reset circuit including a NOR gate and further including a second set series-coupled inverters, an output of the NOR gate electrically coupled to an input of the second set of series-coupled inverters, the complement reset circuit configured to, in response to receiving the complement increment signal from the first differential latch and further in response to receiving the complement decrement signal from the second differential latch, drive the complement reset signal to the first differential latch and further drive the complement reset signal to the second differential latch.

18. The apparatus of claim 17, wherein the differential AND gate further comprises:
a first cross-coupled inverter, a first terminal of the first cross-coupled inverter electrically coupled to an output of the true reset circuit, and a second terminal of the first cross-coupled inverter electrically coupled to an output of the complement reset circuit, the first cross-coupled inverter configured to reduce skew between the true reset signal and the complement reset signal.

19. The apparatus of claim 18, wherein the first set of series-coupled inverters is a first set of at least three inverters, wherein the second set of series-coupled inverters is a second set of at least three inverters, and wherein the differential AND gate further comprises:
a second cross-coupled inverter, a first terminal of the second cross-coupled inverter electrically coupled to the true reset circuit between an output of a second inverter of the first set of at least three inverters and an input of a third inverter of the first set of at least three inverters, and a second terminal of the second cross-coupled inverter electrically coupled to the complement reset circuit between an output of a second inverter of the second set of at least three inverters and an input of a third inverter of the second set of at least three inverters, the second cross-coupled inverter configured to reduce skew between the true reset signal and the complement reset signal.

20. The apparatus of claim 16, wherein a first at least one differential buffer is electrically coupled between an output of the first differential latch and the charge pump, the first at least one differential buffer configured to reduce skew between the true increment signal and the complement increment signal, and wherein a second at least one differential buffer is electrically coupled between an output of the second differential latch and the charge pump, the second at least one differential buffer configured to reduce skew between the true decrement signal and the complement decrement signal.

* * * * *